United States Patent
Wang

[19]

[11] Patent Number: 6,087,897
[45] Date of Patent: Jul. 11, 2000

[54] OFFSET AND NON-LINEARITY COMPENSATED AMPLIFIER AND METHOD

[75] Inventor: Binan Wang, Tucson, Ariz.

[73] Assignee: Burr-Brown Corporation, Tucson, Ariz.

[21] Appl. No.: 09/306,018

[22] Filed: May 6, 1999

[51] Int. Cl.[7] .................................................. H03F 1/14
[52] U.S. Cl. ................................ 330/9; 330/51; 327/124
[58] Field of Search ................................ 330/9, 51, 253; 327/127, 307

[56] References Cited

U.S. PATENT DOCUMENTS

| | | | |
|---|---|---|---|
| 3,434,069 | 3/1969 | Jones | 330/30 |
| 3,694,760 | 9/1972 | Loessi | 330/9 |
| 3,908,173 | 9/1975 | Murdock | 330/30 |
| 3,988,689 | 10/1976 | Ochi et al. | 330/9 |
| 4,577,336 | 3/1986 | Kriedt et al. | 377/111 |
| 4,621,238 | 11/1986 | Fenk | 330/254 |
| 4,701,720 | 10/1987 | Monticelli | 330/260 |
| 4,757,270 | 7/1988 | Rokos | 330/103 |
| 4,843,345 | 6/1989 | Söderström | 330/282 |
| 4,999,584 | 3/1991 | Eskelinen | 330/107 |
| 5,229,721 | 7/1993 | Stade | 330/265 |
| 5,410,270 | 4/1995 | Rybicki et al. | 330/9 |
| 5,539,779 | 7/1996 | Nagahori | 375/317 |
| 5,736,895 | 4/1998 | Yu et al. | 330/9 |
| 5,798,664 | 8/1998 | Nagahori et al. | 327/307 |
| 5,847,601 | 12/1998 | Wang | 330/9 |
| 5,869,999 | 2/1999 | Mawet | 330/51 |
| 6,011,433 | 4/1999 | Nairn | 330/51 |

*Primary Examiner*—Robert Pascal
*Assistant Examiner*—Khanh Van Nguyen
*Attorney, Agent, or Firm*—Cahill, Sutton & Thomas P.L.C.

[57] ABSTRACT

Circuitry in an amplifier (1) provides both auto-zeroing of offset errors and finite gain compensation. The circuitry includes a differential main amplifier (3) and a differential auxiliary amplifier (13). During a first phase ($\phi 1$), a previously sampled input voltage is amplified by the main amplifier to produce an output voltage on a first capacitor (C3). A stored prior offset correction voltage stored on a second capacitor (C4A) is applied between the inputs of the auxiliary amplifier, an output of which is coupled to an auxiliary input of the main amplifier to auto-zero its offset voltage. During a second phase ($\phi 2$) the inputs of the main amplifier are short-circuited together, causing it to produce a voltage change on one terminal of the first capacitor (C3), the other terminal of which is switched from ground to one terminal of a second capacitor (C4). This stores updated offset correction voltage on the second capacitor (C4). Since the previous output voltage of the main amplifier remains stored on the first capacitor (C3) during the second phase, the auto-zeroing correction is referenced to the previous value of the output voltage, resulting in compensation for distortion caused by non-linearity of the main amplifier.

14 Claims, 4 Drawing Sheets

OFFSET AND NON-LINEARITY COMPENSATED AMPLIFIER AND METHOD

BACKGROUND OF THE INVENTION

The invention relates to auto-zeroing circuits, and more specifically to an auto-zeroing circuit that compensates for both offset of an amplifier and gain linearity error of the amplifier, without use of complex, multiple-stage, high gain circuitry in the amplifier.

By way of background, auto-zeroing techniques, also referred to as correlated double sampling techniques, are commonly used in high precision switched capacitor circuit designs to minimize offset errors and low frequency errors. Ordinarily, a "gained up" offset error of the main amplifier is stored on a capacitor which then is sampled by an auxiliary amplifier. The output of the auxiliary amplifier is applied as an auxiliary input to the main amplifier to force an internal correction of the offset error.

However, another error source in a switched capacitor circuit design is non-linear gain of the operational amplifier. This can be described with reference to the prior art circuit shown in FIG. 4, which is described in "A Micropower CMOS-Instrumentation Amplifier", by M. Degrauwe et al., IEEE Journal of Solid-State Circuits, Vol. SC20, No. 3, June 1985, pp 805–807. Referring to FIG. 4, a switched capacitor sampling stage including capacitor C1 and switches S1, S2, and S5 couples $V_{IN}$ to a summing node 12 connected to the (−) input of a main amplifier 3 having a gain A1. A switched capacitor network including capacitor C2 and switches S8 and S9 is coupled between summing node 12 and output conductor 19 of main amplifier 3, on which $V_{OUT}$ is produced. A switch S12 couples output conductor 19 to a subsequent stage (not shown). An auxiliary amplifier 13 having gain A2 has its output coupled to an adjustment input of main amplifier A1. The (+) input of auxiliary amplifier 13 is connected to one plate of a capacitor C4, the other plate of which is connected by fixed reference voltage conductor 23 to the (+) input of auxiliary amplifier A2. Typically, the gain A1 is not constant, but varies with $V_{OUT}$. That causes distortion of $V_{OUT}$ relative to $V_{IN}$.

$\phi 1$ and $\phi 2$ are non-overlapping clock signals, $\phi 2$ being a sampling phase in which $V_{IN}$ is sampled onto capacitor C1 and feedback capacitor C2 is reset. $\phi 1$ is a charge transfer phase during which $V_{IN}$ is amplified by approximately the ratio of C1 to C2 at the output of main amplifier 3. $\phi 1$ is also the phase during which the output voltage $V_{OUT}$ is sampled by the following stage (not shown). During each $\phi 2$ phase, the (+) and (−) inputs of main amplifier 3 are short circuited together, so that the value of $V_{OUT}$ during $\phi 2$ is a correction voltage approximately equal to $V_{OS} \cdot (A1/A2)$, where $V_{OS}$ is the input offset voltage of main amplifier 3. The correction voltage is always "referenced to a fixed reference voltage", meaning that the feedback through auxiliary amplifier 13 keeps $V_{OUT}$ close to the fixed reference voltage. Switch S11 is closed, so that correction voltage is stored on capacitor C4 and causes auxiliary amplifier 13 to produce a correction current or voltage in an auxiliary input to main amplifier 3 so as to cancel the input offset voltage $V_{OS}$ thereof. The same correction voltage $V_{OS} \cdot (A1/A2)$ is stored on capacitor C4 during every $\phi 2$ phase, and during every $\phi 1$ phase auxiliary amplifier 13 applies the same correction current or voltage to the auxiliary input of main amplifier 13 to cancel the effect of $V_{OS}$. Unfortunately, since the gain A1 is non-linear, A1 has a different value when $V_{OUT}$ is close to zero than if $V_{OUT}$ has a relatively high value. This produces undesired distortion in the value of $V_{OUT}$.

Traditionally, such non-linear gain error is reduced by providing large, open loop gain in the main amplifier. However, that usually requires an expensive, multi-stage amplifier of complex design. Known finite gain compensation techniques are used to suppress distortion error due to non-linear amplifier gain.

SUMMARY OF THE INVENTION

Accordingly, it is an object of the invention to provide an auto-zeroing technique and circuit which corrects both input offset errors and non-linearity errors of an amplifier.

It is another object of the invention to simplify the design of an amplifier including auto-zeroing circuitry and finite gain compensation circuitry.

It is another object of the invention to provide a single stage amplifier including auto-zeroing and finite gain compensation circuitry which requires minimal slew capability.

Briefly described, and in accordance with one embodiment thereof, the invention provides a circuit and technique for accomplishing both auto-zeroing of offset errors and finite gain compensation. During a first phase ($\phi 1$) a charge corresponding to an input voltage ($V_{IN}$) previously sampled onto a first capacitor (C1) is transferred through a summing node (12) of a first amplifier (3) into a switched capacitor feedback circuit. The first amplifier causes an output voltage ($V_{OUT}$) to change to a value that maintains the summing node (12) at a virtual ground voltage so as to cause the charge to be stored in a feedback capacitor (C2) of the switched capacitor feedback circuit. A second capacitor (C3) has a first terminal coupled to receive the output voltage ($V_{OUT}$). A third capacitor (C4) has a first terminal coupled to a first input (−) of a second amplifier (13) and a second terminal coupled to a second input (+) of the second amplifier. An output of the second amplifier (13) is coupled to an auxiliary input of the first amplifier to increase or decrease the output voltage ($V_{OUT}$) according to the polarity of a voltage stored on the third capacitor. A second terminal of the second capacitor (C3) is simultaneously coupled to a reference voltage (23) so that a voltage across the second capacitor (C3) changes according to the change in the value of the output voltage ($V_{OUT}$). During second phase ($\phi 2$) a switched capacitor input stage (2) is operated to sample an analog input voltage ($V_{IN}$) onto the first capacitor (C1). The summing node (12) is connected to an inverting input (−) of the first amplifier (3), the second terminal of the second capacitor (C3) is decoupled from the reference voltage (23), and the first terminal of the second capacitor (C3) is coupled to a first input (−) of a second amplifier (13) and a first terminal of a second capacitor (C3). A second terminal of the third capacitor (C4) is connected to the reference voltage (23) and a second input (+) of the second amplifier (13). A change in the output voltage ($V_{OUT}$) representative of the offset voltage ($V_{OS}$) of the first amplifier (3) is coupled by the second capacitor (C3) onto the third capacitor (C4). The second amplifier compensates the offset of the first amplifier in accordance with the voltage stored on the third capacitor (C4). The previous value of the output voltage ($V_{OUT}$) is stored on the second capacitor (C3) between the first and second phases, so the first amplifier does not need to charge the second capacitor (C3) any more than the small change in the output voltage ($V_{OUT}$). Both input offset errors and non-linearities of the main amplifier are compensated by the circuitry of the invention.

DETAILED DESCRIPTION OF THE PREFERRED EMBODIMENTS

Figure 1:
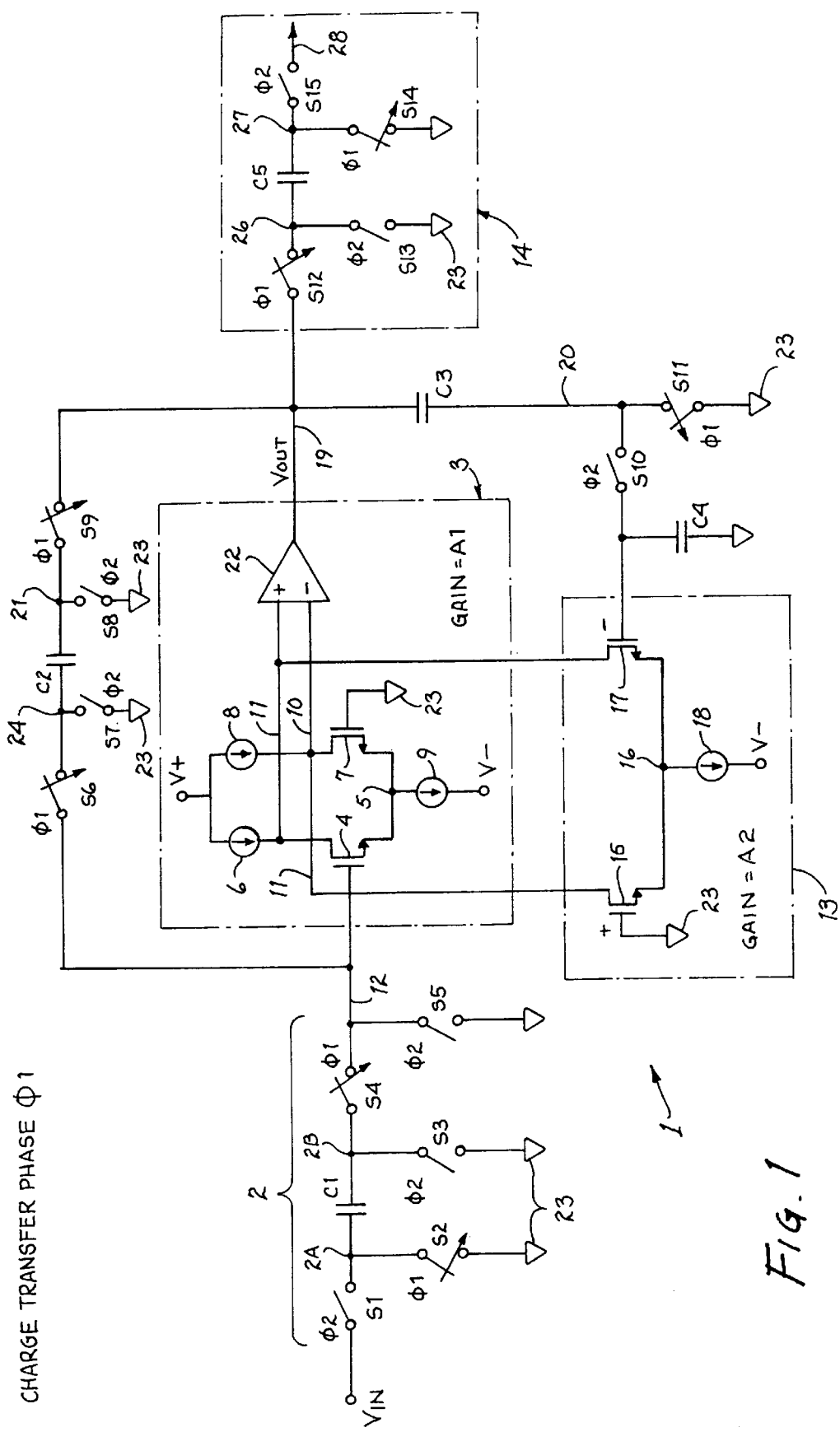
FIG. 1 is a schematic diagram of the auto-zeroing and linearity error correction circuit of the invention, with the switch configurations shown for a first phase of operation.

Referring to FIG. 1, an input voltage $V_{IN}$ is applied by a switch S1 to an input conductor 2A of a typical switched capacitor input stage 2 of the offset compensated and non-linearity compensated amplifier 1 of the present invention. A sampling capacitor C1 is connected between conductors 2A and 2B. Conductor 2A is coupled by a switch S2 to a fixed reference conductor 23, which can be ground or other fixed reference voltage. Conductor 2B is coupled to ground by a switch S3 and to a summing conductor 12 by a switch S4. The output of input stage 2 is connected by summing conductor 12 to the (+) input of a single stage main amplifier 3. A conventional switched capacitor circuit including a switched feedback capacitor C2 is connected between the (+) input and the output conductor 19 of main amplifier 3. A terminal 24 of feedback capacitor C2 is coupled by switch S6 to summing conductor 12 and by switch S7 to reference voltage conductor 23. The other terminal 21 of feedback capacitor C2 is coupled to one terminal of each of switches S8 and S9. The other terminal of switch S8 is connected to reference voltage conductor 23. The other terminal of switch S9 is connected to output conductor 19. A voltage $V_{OUT}$ produced on conductor 19 by main amplifier 3 is applied to a utilization circuit 14 which, for example, can be a switched capacitor input stage of a delta-sigma modulator with a sampling capacitor C5. However, any other analog or digital circuit could be connected to output conductor 19 instead.

Main amplifier 3 includes an input stage including a first pair of source-coupled N-channel input MOSFETs 4 and 7 having their drain electrodes coupled by load devices 6 and 8, respectively, to a supply voltage V+. Load devices 6 and 8 can be ordinary P-channel current mirror output MOSFETs. The common sources of MOSFETs 4 and 7 are connected to an ordinary constant current source 9. The gate of MOSFET 4 is connected to the (−) input of main amplifier 3 and hence to summing conductor 12. The gate of MOSFET 7 and the (+) input of main amplifier 3 are connected to reference voltage conductor 23. Differential-to-single-ended converter circuit 22 of main amplifier 3 as shown in FIG. 1 produces $V_{OUT}$ on conductor 19 in response to the signals on conductors 10 and 11. (The voltages on conductors 10 and 11 could be used as outputs of main amplifier 3 if the following stage had differential inputs, in which case differential-to-single-ended converter 22 would be omitted.) Other configurations for the structure of main amplifier 3 also could be used.

Figure 1A:
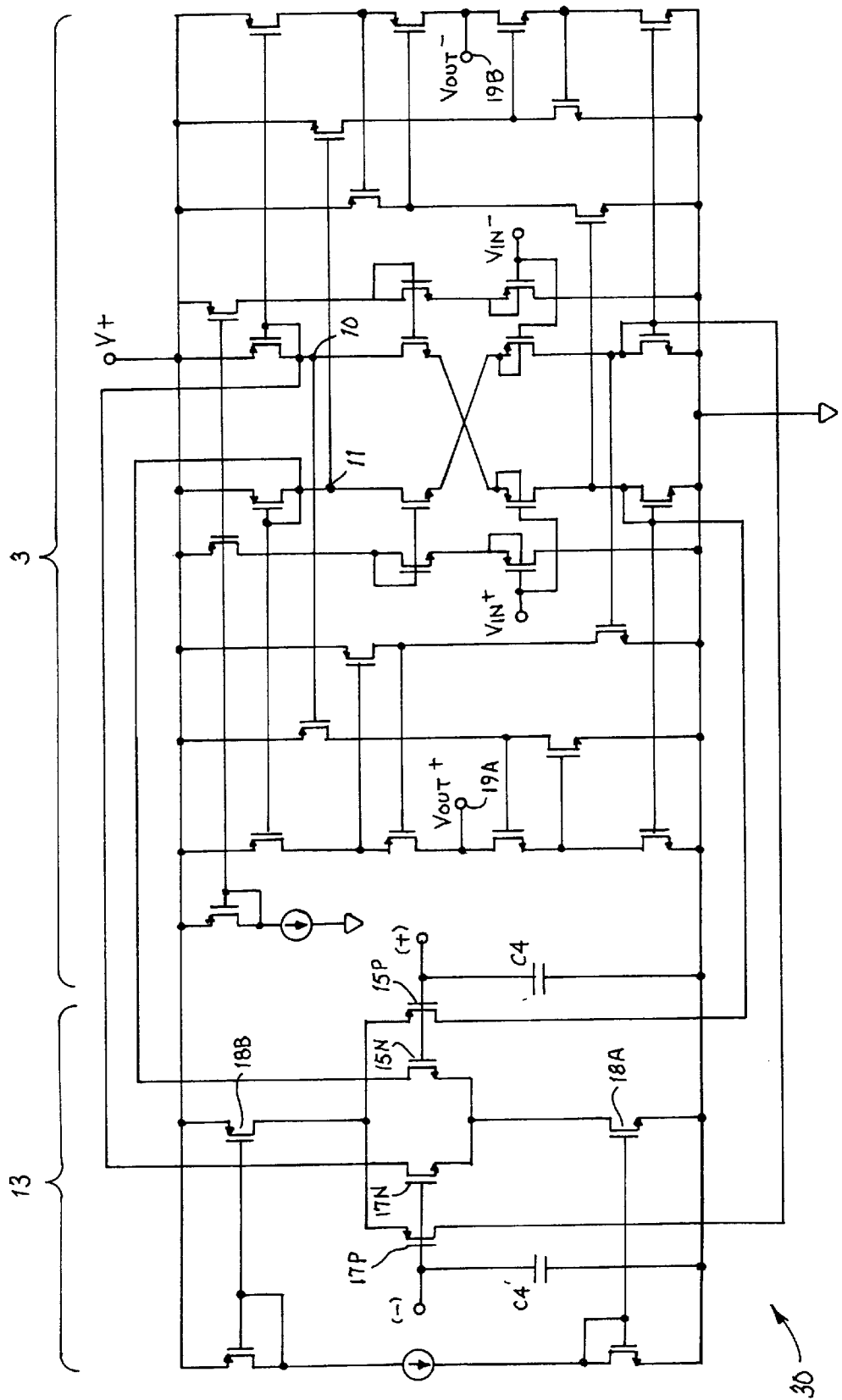
FIG. 1A is a detailed schematic diagram of a CMOS differential implementation of amplifier 3 in FIG. 1.
Figure 3:
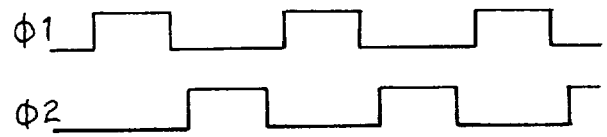
FIG. 3 is a timing diagram useful in explaining the operation of the circuit of FIG. 1.
Figure 4:
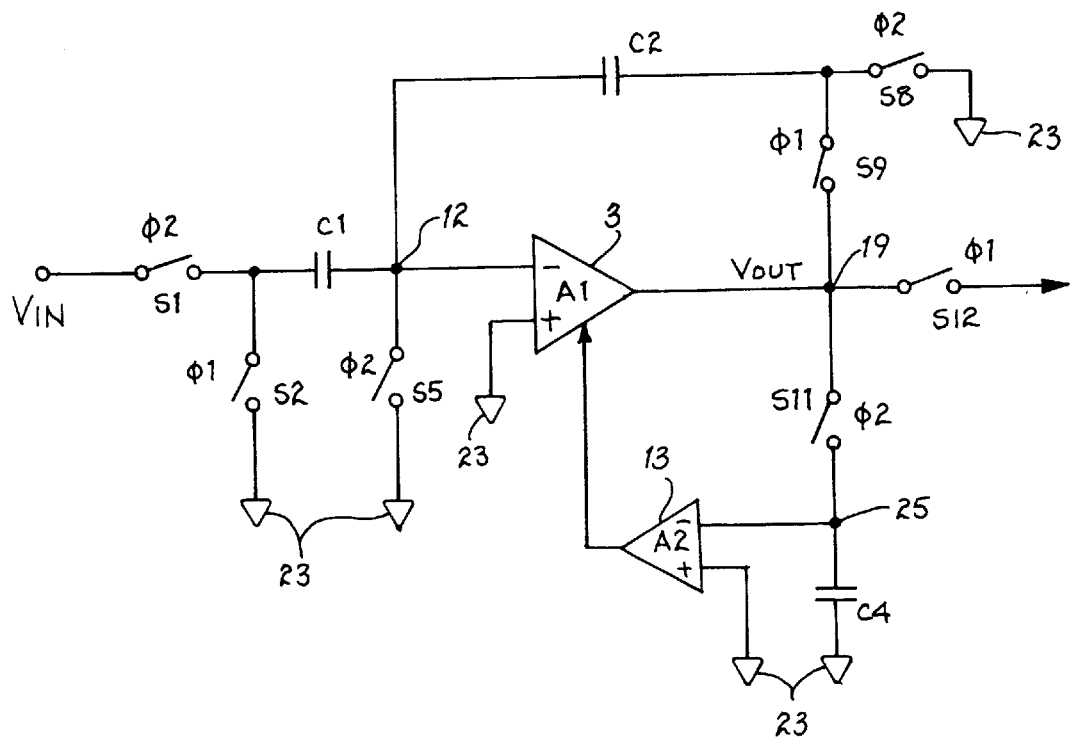
FIG. 4 is a schematic diagram of an amplifier with prior art auto-zeroing circuitry.

The best mode of the invention presently contemplated includes the fully differential CMOS amplifier circuit 30 shown in FIG. 1A. The portion indicated by numeral 3 is a differential amplifier that corresponds to main amplifier 3 in FIG. 1. The differential input signal constitutes the two input signals $V_{IN}+$ and $V_{IN}-$. The differential output constitutes $V_{OUT}^+$ on conductor 19A and $V_{OUT}^-$ on conductor 19B. Since the output signal is differential, no differential-to-single-ended converter 22 as shown in FIG. 3 is required.

The differential circuit 3 shown in FIG. 1A is used with the common mode feedback control described in commonly assigned U.S. Pat. No. 5,847,601 entitled "Switched Capacitor Common Mode Feedback Circuit for Differential Operational Amplifier and Method", by Binan Wang, incorporated herein by reference.

Referring again to FIG. 1, and in accordance with the present invention, a first terminal of a switched capacitor C3 is connected to output conductor 19, and a second terminal of capacitor C3 is connected to conductor 20, which is coupled by switch S11 to reference voltage conductor 23. The previous value of $V_{OUT}$ therefore is stored on capacitor C3 when switch 11 is opened during the $\phi 2$ phase. Conductor 20 also is coupled by a switch S10 to conductor 25, which is connected to the (−) input of an auxiliary amplifier 13.

Auxiliary amplifier 13 includes a second pair of source-coupled N-channel input MOSFETs 15 and 17, the sources of which are connected by conductor 16 to a constant current source 18. Conductor 25 is connected to the gate of MOSFET 17 and to one terminal of a capacitor C4. The other terminal of capacitor C4 is connected to reference voltage conductor 23, the (+) input of auxiliary amplifier 13, and the gate of MOSFET 15. The drain of MOSFET 17 is connected by conductor 11 of main amplifier 3 to the drain of input MOSFET 4. MOSFET 17 of auxiliary amplifier 13 thus shares load device 6 with MOSFET 4 of main amplifier 3. Similarly, the drain of MOSFET 15 of auxiliary amplifier 13 is connected by conductor 10 to the drain of MOSFET 7 of main amplifier 3, and thus shares load device 8 with MOSFET 7. Conductors 10 and 11 thus receive the auxiliary inputs from auxiliary amplifier 13. (It would be possible to omit either one of the connections of MOSFET 15 to conductor 11 or of MOSFET 17 to conductor 10, and nevertheless achieve the auto-zeroing and gain compensation benefits of the invention.)

Referring again to FIG. 1A, numeral 13 corresponds to auxiliary amplifier 13 in FIG. 1, and differs from the N-channel differential pair 15,17 in FIG. 1 by providing an N-channel pair of source-coupled N-channel transistors 17N and 15N and a common constant current source 18A, and also includes a pair of source-coupled P-channel MOSFETs 17P and 15P connected to a P-channel constant current source transistor 18B. The capacitors labeled C4 and C4' in FIG. 1A correspond to capacitor C4 in FIG. 1. This dual differential pair structure for auxiliary amplifier 13 in FIG. 1A is helpful in interfacing with main amplifier 3 as shown in FIG. 1A.

Referring back to FIG. 1, switches S2, S4, S6, S9, S11, S12, and S14 are actuated (i.e., closed) by $\phi 1$. Switches S1, S3, S5, S7, S8, S10, S13, and S15 are actuated by $\phi 2$. The waveforms of $\phi 1$ and $\phi 2$ are shown in FIG. 3.

Figure 2:
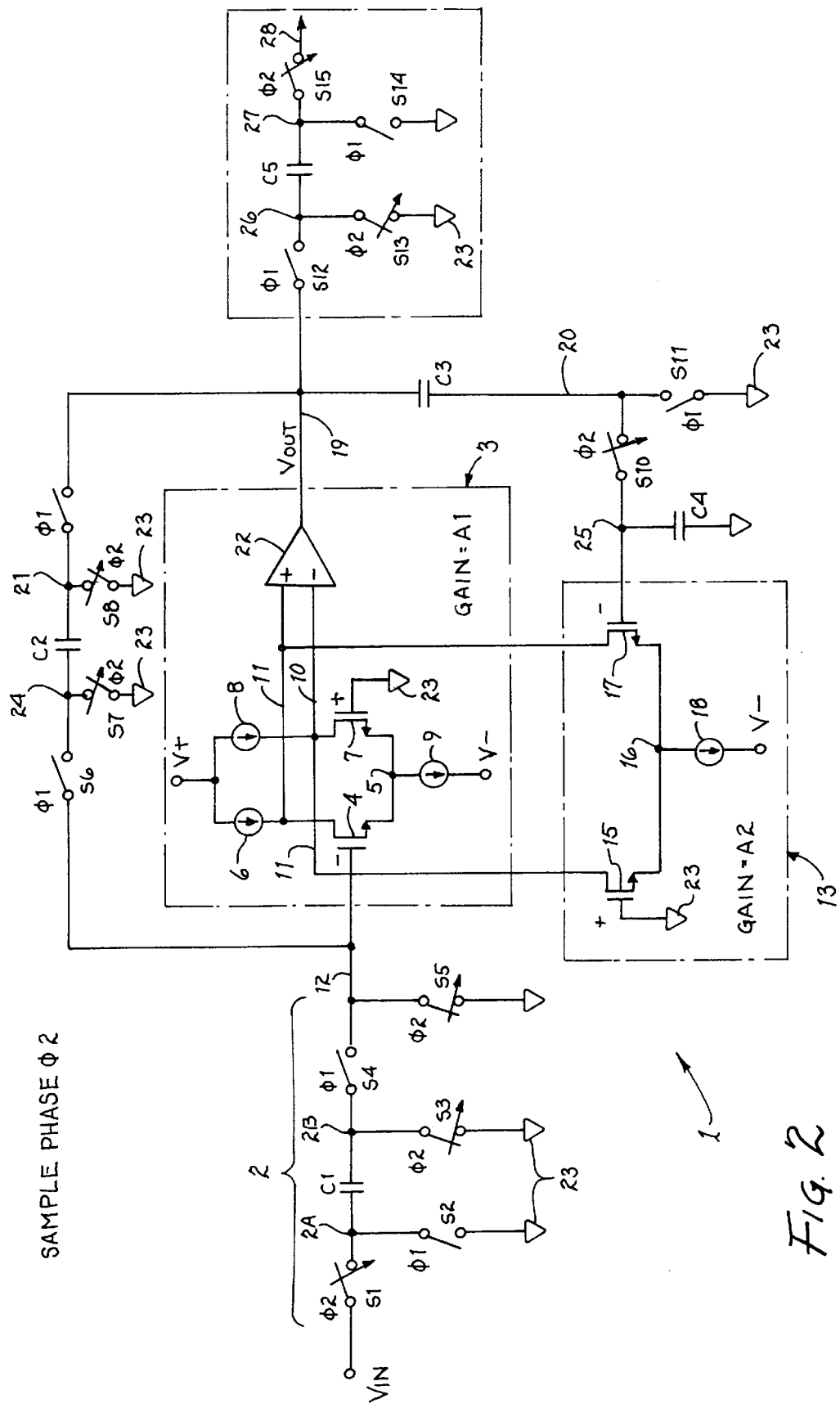
FIG. 2 is a schematic diagram of the circuit of FIG. 1 with the switch configurations shown for a second phase of operation.

FIG. 1 shows the circuit structure and the configuration of the various switches during a first phase $\phi 1$ in which charge from a previous sampling of $V_{IN}$ is transferred to amplifier feedback capacitor C2. During $\phi 1$ amplifier 3 causes $V_{OUT}$ to assume a level necessary to keep the voltage on conductor 12 at a virtual ground voltage equal to that of reference voltage conductor 23. FIG. 2 shows amplifier circuit 1 during a second phase $\phi 2$ with different switch configurations, in which (1) the present value of input voltage $V_{IN}$ is sampled onto sampling capacitor C1, and (2) offset correction (i.e., auto-zeroing) and compensation for non-linear gain of main amplifier 3 are simultaneously accomplished.

During phase $\phi 1$ switches S2, S4, S6, S9, S11, S12 and S14 are closed and the remaining switches are open. This configuration causes an amount of charge corresponding to the value of $V_{IN}$ previously sampled onto capacitor C1 (during the prior φ2 phase) to be transferred into summing node 12 of main amplifier 3. Since switches S6 and S9 connect feedback capacitor C2 between $V_{OUT}$ and summing node 12, main amplifier 3 maintains summing node 12 at the virtual ground voltage, causing $V_{OUT}$ to assume a value $V_{OUT} \approx V_{IN}$ (C1/C2), which corresponds to the amount of charge transferred from sampling capacitor C1 to feedback capacitor C2, in accordance with a gain determined by the ratio of the capacitances of input sampling capacitor C1 to feedback capacitor C2. Since switches S11, S12, and S14 are closed, capacitors C3 and C5 then are charged to the new value of $V_{OUT}$, which corresponds to the value of $V_{IN}$ last sampled (during the previous φ2 phase) onto sampling capacitor C1.

It should be understood that if it were not for the operation of auxiliary amplifier 13, any input offset voltage between MOSFETs 4 and 7 would produce a corresponding error voltage in $V_{OUT}$. However, auxiliary amplifier 13 compensates main amplifier 3 for the input offset voltage $V_{OS}$ in response to the offset error correction voltage temporarily stored on capacitor C4 during the previous φ2 phase, as subsequently explained. Specifically, auxiliary amplifier 13 amplifies an offset correction voltage $V_{OS\text{-}CORR}$ stored on capacitor C4 and accordingly adjusts the voltages on conductors 10 and 11 so that the error on summing node 12 due to the offset voltage $V_{OS}$ of main amplifier 3 is nearly eliminated.

During the "input sample, auto-zero, and amplifier reset" phase φ2, switches S1, S3, S5, S7, S8, S10, S13, and S15 are closed and the remaining switches are open, as shown in FIG. 2. Consequently, input capacitor C1 is charged to the present value of $V_{IN}$. Also, both the (+) and (−) inputs of main amplifier 3 are shorted together by closed switch S5 and reference voltage conductor 23. Feedback capacitor C2 is disconnected from conductors 12 and 19 by open switches S6 and S9, and also is reset to zero by closed switches S7 and S8. The input offset voltage $V_{OS}$ caused by any mismatch in the sizes and/or threshold voltages of input MOSFETs 4 and 7 of main amplifier 3 causes, in effect, a change equal to approximately $V_{OS} \cdot (A1/A2)$ to be superimposed on the value of $V_{OUT}$ on conductor 19, where A1 is the closed loop gain of main amplifier 3 with $V_{OUT}$ equal to the voltage stored on capacitor C3 during the previous φ1 phase and A2 is the closed loop gain of auxiliary amplifier 13. Since switch S11 is open, that change in $V_{OUT}$ on conductor 19 is coupled by capacitor C3 onto conductor 20, and since switch S10 is closed, nearly all of the $V_{OS} \cdot (A1/A2)$ voltage change on conductor 19 is coupled onto and stored as correction voltage $V_{OS\text{-}CORR}$ on capacitor C4.

Then, during the next "charge transfer" phase φ1, input MOSFETs 16 and 17 of auxiliary amplifier 13 produce complementary correction currents flowing in conductors 10 and 11 so as to compensate for the input offset voltage $V_{OS}$ of main amplifier 3.

It is important to recognize that the above described operation uses the previous value of $V_{OUT}$ stored across capacitor C3 as the reference point for the above described change in $V_{OUT}$ during φ2 and hence for the auto-zeroing correction produced by the drain currents of MOSFETs 15 and 17 of auxiliary amplifier 13. The result is that main amplifier 3 appears to have a much higher open loop gain than it really has, provided that the previously sampled value of $V_{IN}$ does not differ too much from the present one. Since capacitor C3 "memorizes" the previous value of $V_{OUT}$, each correction voltage $V_{OS\text{-}CORR}$ stored on capacitor C4 is dependent on the value of the closed loop gain A1 at the most recent value of $V_{OUT}$ produced on conductor 19 during the previous φ1 phase. The memorized value of $V_{OUT}$ stored across capacitor C3 allows the output of main amplifier 3 to remain at or near the last value of $V_{OUT}$ during the auto-zeroing process. Since the auto-zeroing is performed by using the previous output as the reference point rather than using a fixed voltage, and provided that the input signal is not fast varying (this condition can be met in applications such as an oversampling converter system), the auto-zeroing effectively cancels out finite gain error along with the offset from operational amplifier 25 at the system level to help reduce the overall distortion. The correction as a function of successive values of $V_{OUT}$ results in compensation of both input offset errors and finite gain errors caused by the non-linearity of main amplifier 3.

Consequently, during the φ1 phase the summing node error between the (−) and (+) inputs of main amplifier 3 are forced to be nearly zero by auxiliary amplifier 13 for each successive value of $V_{OUT}$. Therefore, the effect of non-linear gain of amplifier 3 is minimized in the auto-zeroing process. The low distortion thus achieved, together with the low summing node error, makes it appear that main amplifier 13 has a very high gain. Thus, a simple single stage main amplifier of low gain A1 can be used instead of an expensive, complex multi-stage amplifier to achieve highly linear, low distortion amplifier operation.

Another advantage of the above described structure and operation over the closest prior art, which does not include capacitor C3 and instead connects conductor 20 directly to conductor 19, is that main amplifier 3 does not have to slew or settle quickly during an auto-zeroing operation because the charge in $V_{OUT}$ is very small. This is another reason why the design constraints on main amplifier 3 can be relaxed and it can be a single stage low gain design. Furthermore, an additional benefit of using a single stage amplifier is that its noise typically is lower than for a multi-stage amplifier.

Thus, the present invention provides an inexpensive alternative auto-zeroing technique using an auxiliary amplifier not only to auto-zero or attenuate the offset and low frequency noise of the main amplifier, but also to compensate for distortion due to non-linear gain of the main amplifier, provided that the input signal does not change rapidly compared to the sampling frequency. This accurate, inexpensive amplifier could be very useful in the area of oversampling delta-sigma analog-to-digital converters, where the sampling frequency usually is much higher than the frequency of the analog input signal.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention. For example nearly any differential input stage can be used in main amplifier 3 as long as it has an auxiliary input, and nearly any differential input stage can be used in the auxiliary amplifier 13. Although the described embodiment provides substantial benefits if main amplifier stage 3 is a single stage amplifier, most of the operating benefits are achieved even if main amplifier 3 is a multi-stage amplifier.

What is claimed is:

1. A method of auto-zeroing and compensating non-linearity errors in a first amplifier, comprising:

(a) transferring a charge corresponding to a first value of an input voltage from a switched first capacitor through a first input node of the first amplifier into a switched feedback capacitor to cause the first amplifier to produce a first value of an output voltage, and charging a switched second capacitor to the first value of the output voltage; and (b) short-circuiting the first input node and a second input node of the first amplifier to cause an incremental change of the output voltage while a second amplifier applies a correction signal to an auxiliary input of the first amplifier in response to a value of a correction voltage stored on a third capacitor to store an updated value of the correction voltage approximately equal to the incremental change on the third capacitor, successive values of the correction voltage being a function of successive values of the output voltage so as to compensate for non-linearity of the first amplifier.

2. A method of auto-zeroing and compensating non-linearity errors in a first amplifier, comprising:

(a) transferring a charge corresponding to a first value of an input voltage from a first capacitor through a first input of the first amplifier into a switched feedback capacitor to cause the first amplifier to produce a first value of an output voltage and charging a second capacitor to the first value of the output voltage while a second amplifier applies a correction signal to an auxiliary input of the first amplifier in response to a value of a correction voltage stored on a third capacitor;

(b) sampling a second value of the analog input voltage onto the first capacitor, short-circuiting the first and second inputs of the first amplifier to cause an incremental change of the output voltage corresponding to values of a gain and an input offset voltage of the first amplifier with the output voltage at the first value, and capacitively coupling the incremental voltage change across the second capacitor to the third capacitor to store an updated value of the correction voltage on the third capacitor; and (c) repeating step (a) for the second value of the input voltage to cause the second amplifier to compensate the first amplifier in response to the updated value of the correction voltage.

3. A method of accomplishing both auto-zeroing of offset errors and compensation of non-linearity errors in an amplifier circuit, comprising:

(a) transferring a charge corresponding to a first value of an input voltage from a first capacitor through a summing conductor of a first amplifier into a switched feedback capacitor to cause the first amplifier to produce a first value of an output voltage on an output thereof, and charging a second capacitor to the first value of the output voltage while a second amplifier applies a correction signal to an auxiliary input of the first amplifier in response to a first value of a correction voltage stored on a third capacitor;

(b) sampling a second value of the analog input voltage onto the first capacitor, short-circuiting first and second inputs of the first amplifier to cause the output to change from the first value of the output voltage by an incremental voltage change corresponding to values of a gain and an input offset voltage of the first amplifier with the output voltage at the first value, and capacitively coupling the incremental voltage change to the third capacitor by means of the second capacitor to store an updated second value of the correction voltage on the third capacitor; and (c) repeating step (a) for the second value of the input voltage to cause the second amplifier to compensate the first amplifier in response to the updated second value of the correction voltage.

4. An amplifier circuit compensated for offset and non-linear gain, comprising:

(a) a switched capacitor input stage including a first capacitor operative to sample an input voltage onto a first capacitor during a sample and auto-zeroing phase and transfer charge into a summing node during a transfer phase;

(b) a first amplifier having a first output, a first auxiliary input, and a differential input stage including a first input connected to the summing node and a second input connected to a fixed reference voltage conductor;

(c) a switched capacitor feedback circuit operative to couple a feedback capacitor between the output and the summing node during the transfer phase;

(d) a second capacitor having a first terminal coupled to the output; and (e) a second amplifier and a third capacitor coupled between a first input and a second input of the second amplifier and switches operative to couple a second terminal of the second capacitor to the fixed reference voltage conductor during the transfer phase and to the first input of the second amplifier during the sample and auto-zeroing phase.

5. The amplifier circuit of claim 4 wherein the second input of the second amplifier is coupled to the fixed reference voltage conductor.

6. An amplifier circuit including auto-zeroing circuitry which also compensates for non-linearity errors, comprising:

(a) means for transferring a charge corresponding to a first value of an input voltage previously sampled onto a first capacitor through a summing conductor into a feedback capacitor during a first phase, the summing conductor being connected to a first input of a first amplifier producing on an output thereof a first value of an output voltage in response to the transferring;

(b) means for storing the first value of the output voltage on a second capacitor during the first phase;

(c) means for capacitively coupling a change of the output voltage of the first amplifier onto a third capacitor coupled between first and second inputs of a second amplifier to store a correction voltage on the third capacitor during a second phase;

(d) means for operating the second amplifier in response to the offset correction voltage during the first phase to apply a correction signal to an auxiliary input of the first amplifier to increase or decrease the output voltage according to the polarity of any correction voltage then stored on the third capacitor;

(e) means for sampling a second value of the analog input voltage onto the first capacitor during the second phase; and (f) means for short-circuiting the first input of the first amplifier to a second input of the first amplifier during the second phase to cause the output voltage to change by an amount corresponding to values of a gain and an input offset voltage of the first amplifier with the output voltage at the first value.

7. An amplifier circuit compensated for offset and non-linear gain, comprising:

(a) a switched capacitor input stage including a first capacitor and switches operative to sample an input voltage onto the first capacitor during a sample phase and transfer charge from the first capacitor into a summing node during a transfer phase;

(b) a first amplifier having a first output, a first auxiliary input, and a differential input stage including a first input connected to the summing node and to a control electrode of a first transistor of the differential input stage and a second input connected to a fixed reference voltage conductor and a control electrode of a second transistor of the differential input stage;

(c) a switched capacitor feedback circuit including a feedback capacitor and switches operative to couple the feedback capacitor between the output and the summing node during the transfer phase;

(d) a second capacitor having a first terminal coupled to the first output and a second terminal coupled to a first terminal of a first switch and a first terminal of a second switch, a second terminal of the first switch being connected to a first terminal of a third capacitor, a second terminal of the third capacitor being connected to the fixed reference voltage conductor; and (e) a second amplifier having a first input coupled to the first terminal of the third capacitor and a second input coupled to the second terminal of the third capacitor and a first output coupled to the first auxiliary input, the second switch being actuated to couple the second terminal of the second capacitor to the fixed reference voltage conductor during the transfer phase to store an output voltage of the first amplifier on the second capacitor, the second switch being actuated to couple the second terminal of the second capacitor to the first terminal of the third capacitor during the sample phase to store a correction voltage on the third capacitor.

8. The amplifier circuit of claim 7 wherein the correction voltage is approximately equal to $V_{OS}(A1/A2)$, wherein $V_{OS}$ is an input offset voltage of the first amplifier, A1 is a gain of the first amplifier, and A2 is a gain of the second amplifier.

9. The amplifier circuit of claim 7 wherein the first amplifier includes a second auxiliary input, and the second amplifier includes a second output coupled to the second auxiliary input.

10. The amplifier circuit of claim 7 wherein the first amplifier includes a second output, wherein the first and second outputs provide a differential output of the amplifier circuit.

11. The amplifier circuit of claim 7 wherein the first and second transistors are N-channel MOSFETs.

12. A method of simultaneously accomplishing both auto-zeroing of offset errors and compensation of non-linearity errors in an amplifier circuit, comprising:

(a) during a first phase, transferring a charge corresponding to a first value of an input voltage previously sampled onto a first capacitor through a summing conductor of a first amplifier into a second capacitor in a switched capacitor feedback circuit, the summing conductor being connected to a first input of the first amplifier, the first amplifier producing a first value of an output voltage so as to maintain the summing conductor at a virtual reference voltage, a third capacitor having a first terminal coupled to receive the output voltage, a fourth capacitor having a first terminal coupled to a first input of a second amplifier and a second terminal coupled to a fixed reference voltage, a second input of the second amplifier being coupled to the fixed reference voltage, a first output of the second amplifier being coupled to a first auxiliary input of the first amplifier to increase or decrease the output voltage according to the polarity of a first value of a correction voltage stored on the fourth capacitor;

(b) simultaneously with step (a), coupling a second terminal of the third capacitor to the fixed reference voltage so that the first value of the output voltage is stored on the third capacitor; and (c) during a second phase, operating a switched capacitor input stage to sample a second value of the analog input voltage onto the first capacitor, short-circuiting the first input of the first amplifier to a second input of the first amplifier to cause the output voltage to change by an amount corresponding to values of a gain and an input offset voltage of the first amplifier with the output voltage at the first value, decoupling the second terminal of the third capacitor from the fixed reference voltage and coupling the second terminal of the third capacitor to the first input of the second amplifier and the first terminal of the fourth capacitor to store a second value of the correction voltage corresponding to the values of the gain and offset voltage of the first amplifier with the output voltage at the first value onto the fourth capacitor to cause the second amplifier to compensate the first amplifier for the input offset voltage.

13. The method of claim 12 wherein the second value of the offset correction voltage is approximately equal to $V_{OS}(A1/A2)$, wherein $V_{OS}$ is the input offset voltage of the first amplifier, A1 is the gain of the first amplifier with its output equal to the first value of the output voltage, and A2 is a gain of the second amplifier.

14. The method of claim 13 wherein a second output of the second amplifier is coupled to a second auxiliary input of the first amplifier, the method including operating the second amplifier to apply a differential compensation current to the first amplifier to auto-zero its input offset voltage.

* * * * *